United States Patent
Su

(10) Patent No.: US 10,420,243 B1
(45) Date of Patent: Sep. 17, 2019

(54) ELECTRONIC DEVICE WITH BUILT-IN MOUNTING MECHANISM

(71) Applicant: NANNING FUGUI PRECISION INDUSTRIAL CO., LTD., Nanning (CN)

(72) Inventor: Feng-Ching Su, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 16/223,406

(22) Filed: Dec. 18, 2018

(51) Int. Cl.
*H05K 7/14* (2006.01)
*H05K 5/02* (2006.01)

(52) U.S. Cl.
CPC ......... *H05K 7/1401* (2013.01); *H05K 5/0221* (2013.01); *H05K 7/1404* (2013.01)

(58) Field of Classification Search
CPC .. H05K 7/1401; H05K 7/1404; H05K 5/0221; G06F 1/1607; G06F 1/1632; G06F 1/1626; G06F 1/1647; G06F 1/1649; G06F 1/188
See application file for complete search history.

(56) References Cited

U.S. PATENT DOCUMENTS

| 8,638,557 | B2 * | 1/2014 | Tsai | F16M 11/041 248/919 |
| 8,833,716 | B2 * | 9/2014 | Funk | F16M 13/02 248/316.4 |
| 9,955,598 | B1 * | 4/2018 | Wen | H05K 7/1428 |
| 10,285,288 | B1 * | 5/2019 | Su | H05K 5/0208 |
| 2004/0087199 | A1 * | 5/2004 | Tran | H05K 7/1007 439/342 |
| 2011/0039437 | A1 * | 2/2011 | Xiao | H05K 7/1007 439/331 |
| 2012/0293925 | A1 * | 11/2012 | Su | F16M 13/02 361/679.01 |
| 2013/0342978 | A1 * | 12/2013 | Zhao | H05K 5/0221 361/679.01 |
| 2015/0312667 | A1 * | 10/2015 | Lei | H04R 1/1033 242/379 |

\* cited by examiner

*Primary Examiner* — Abhishek M Rathod
(74) *Attorney, Agent, or Firm* — ScienBiziP, P.C.

(57) ABSTRACT

An electronic device with inbuilt mounting mechanism includes a first housing defining a first receiving hole, a second housing defining a second receiving hole, and a mounting mechanism. The mounting mechanism includes a rotary plate, a driving rod, and two clamping members which can slide. The driving rod includes a cam-shaped portion and a rod portion. The rod portion is connected to the rotary plate and the two clamping member move toward each other when the cam-shaped portion is rotated by the rotary plate. The two clamping members cooperatively clamp a fixing member to mount the electronic device to the fixing member.

16 Claims, 8 Drawing Sheets

ELECTRONIC DEVICE WITH BUILT-IN MOUNTING MECHANISM

FIELD

The disclosure generally relates to mountings for electronic devices.

BACKGROUND

Communication electronic devices and monitors used indoors can be placed on tables, or installed on walls or ceilings. When mounting the electronic device to the ceiling, a mounting bracket is mounted to an aluminum bar of the ceiling, and then the electronic device is mounted to the mounting bracket.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Figure 1:
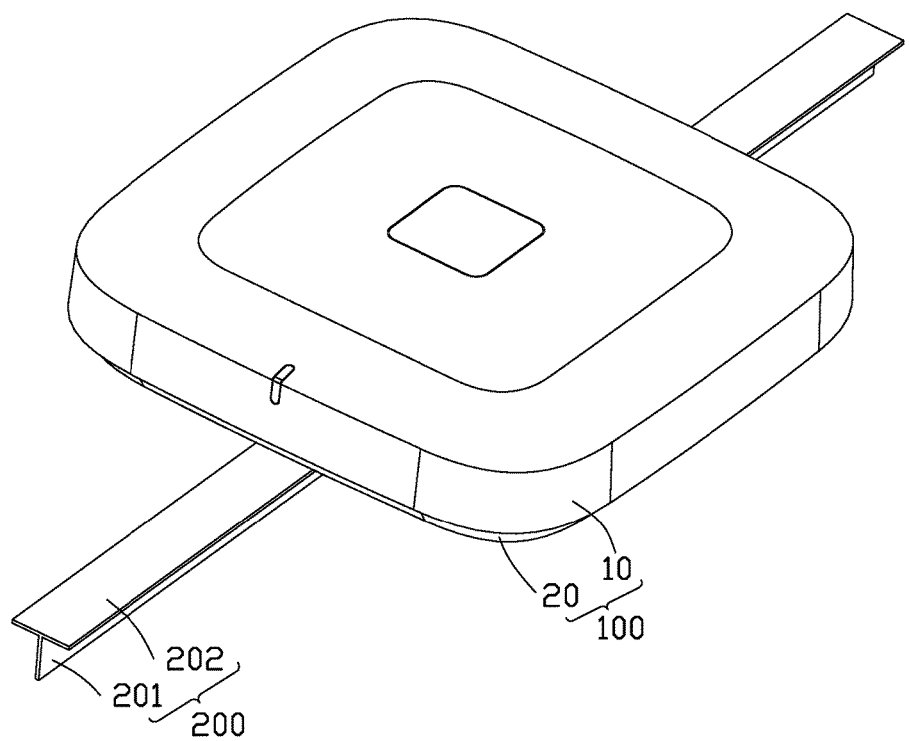
FIG. 1 is an isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Figure 2:
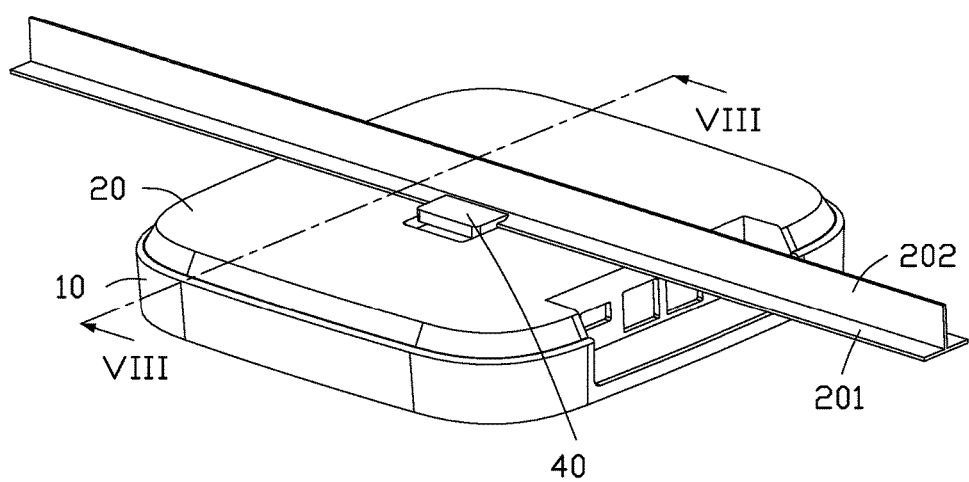
FIG. 2 is similar to FIG. 1, but viewed from another angle.

FIG. 1 and FIG. 2 show an embodiment of an electronic device 100 according to the present disclosure. The electronic device 100 includes a first housing 10 and a second housing 20 connected to the first housing 10. The electronic device 100 is adapted for mounting to a fixing member 200. The fixing member 200 includes a first fixing portion 201 and a second fixing portion 202. The second fixing portion 202 is perpendicular to the first fixing portion 201 and connected to a central portion to the first fixing portion 201. In at least one embodiment, the fixing member 200 may be an aluminum bar of a ceiling. In other embodiments, the fixing member 200 may be a bracket arranged on a desk or a wall. The electronic device 100 may be, but is not limited to, a projector, or a monitor. The electronic device 100 further includes a mounting mechanism 40 for clamping the fixing member 200.

Figure 3:
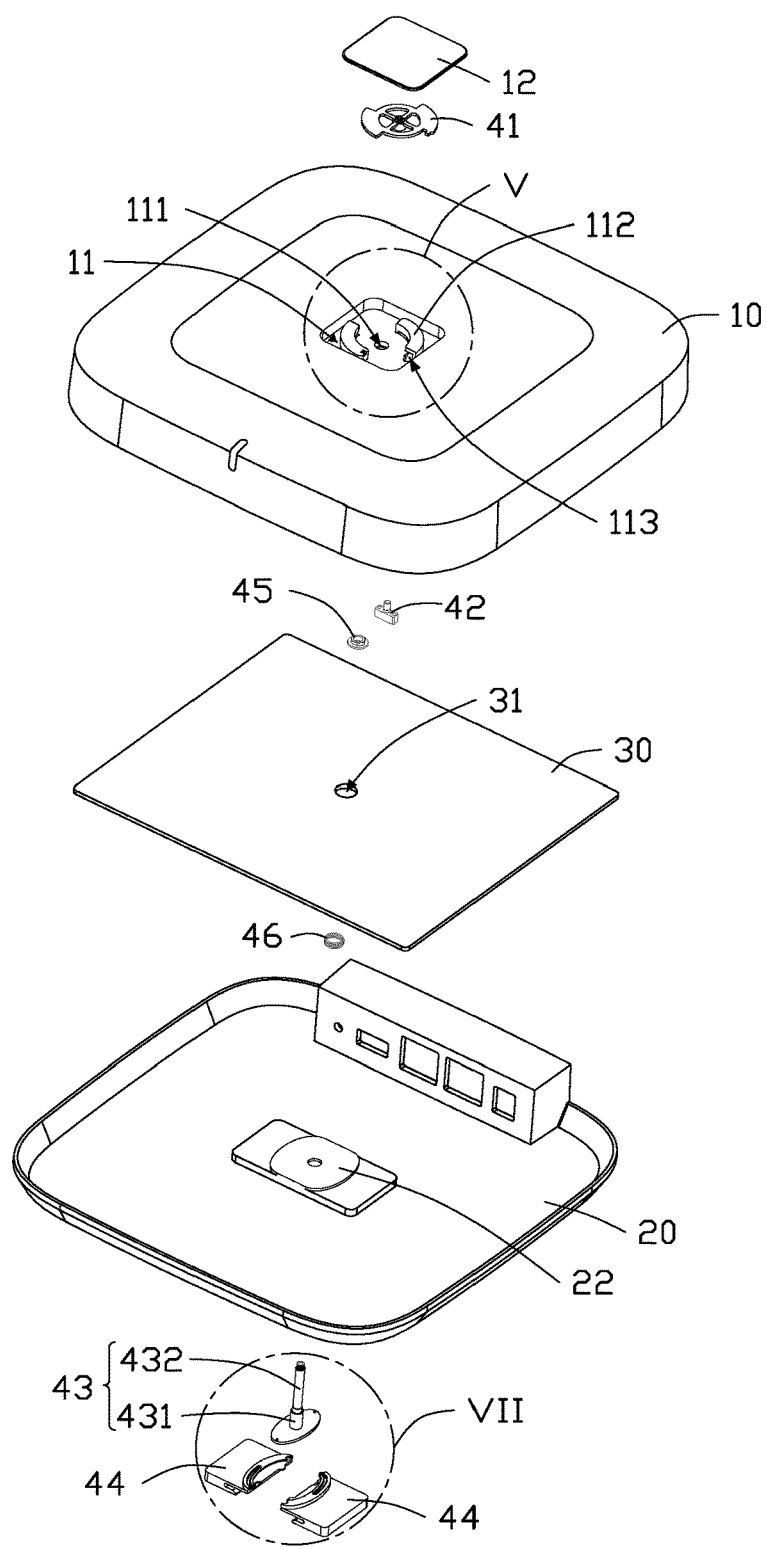
FIG. 3 is an exploded isometric view of the electronic device of FIG. 1.

FIG. 3 shows that an outer surface of the first housing 10 away from the second housing 20 defines a first receiving groove 11. The first receiving groove 11 can be substantially rectangular. A central portion of the receiving groove 11 defines a first through hole 111, and two guiding rails 112 protrude out of a bottom surface of the first receiving groove 11. The two guiding rails 112 may be arranged at two sides of the first though hole 111 and be symmetrical relative to the first hole 111. The electronic device 100 further includes a decorative cover detachably connected to the first housing 10 and configured to cover the first receiving groove 11.

Figure 4:
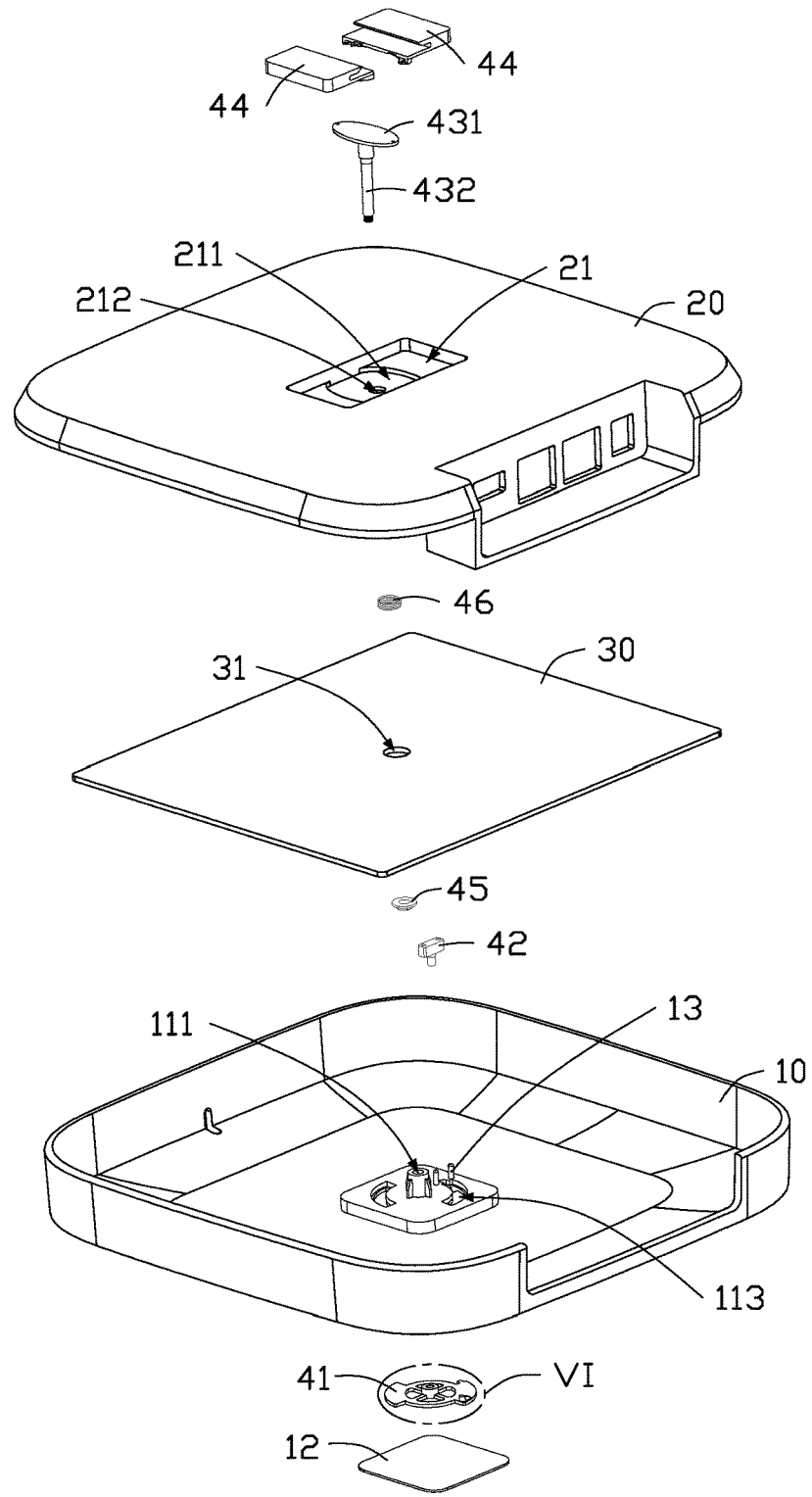
FIG. 4 is similar to FIG. 3, but viewed from another angle.

FIG. 4 shows that an inner surface of the first housing 10 toward the second housing 20 includes a guiding column 13. The guiding column 13 is arranged adjacent to one opening 113. An outer surface of the second housing 20 away from the first housing 10 defines a second receiving groove 21. The second receiving groove 21 can be substantially rectangular. A bottom portion of the second receiving groove 21 defines a concave portion 211, and the second concave portion 211 defines a second through hole 212. In at least one embodiment, the concave portion 211 may be substantially elliptic.

Figure 5:
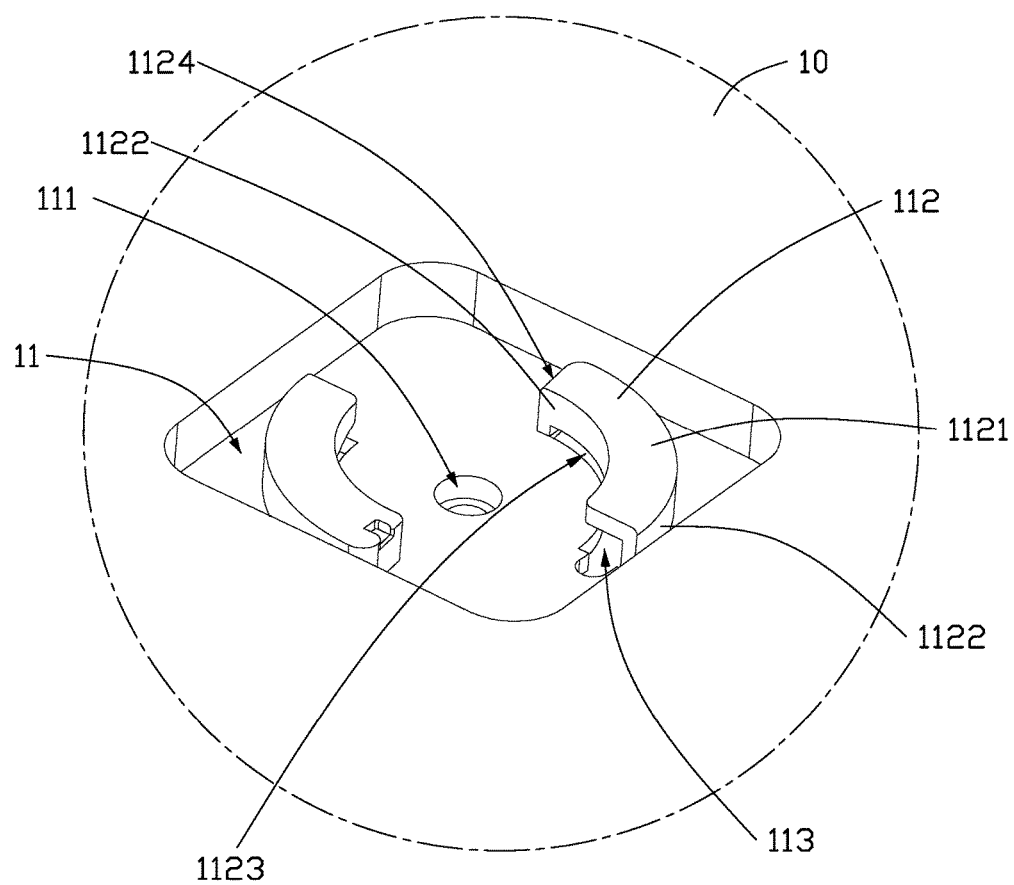
FIG. 5 is an enlarged view of circled portion V of the electronic device shown in FIG. 3.

FIG. 5 shows that each guiding rail 112 is uniformly curved and includes a top surface 1121 and two side surfaces 1122. The top surface 1121 is arranged at the guiding rail 112 away from the bottom of the first receiving groove 11. Each side surface 1122 is connected between the top surface 1121 and the bottom surface of the first receiving groove 11. The side surface 1121 adjacent to the first through hole 111 defines a via hole 1123, and the via hole 1123 is defined at a side of the side surface 1121 facing the bottom of the first receiving groove 11. One end of the side surface 1122 is open, and other end of the side surface 1122 includes a blocking surface 1124. The blocking surface 1124 is connected between the two side surfaces 1122 and perpendicular to the top surface 1121. Preferably, the uniform curve of each guiding rail 112 extends through 90 degrees of a periphery of a circle.

The first receiving groove 11 may further define two openings 113. Each opening 113 extends through the first housing 10, and each opening 113 faces the top surface 1121 of a guiding rail 112. An accommodating space is formed between the guiding rail 112 and the opening 113. Each opening 113 is curved and has same length as the guiding rail 112. In at least one embodiment, the two guiding columns 13 of FIG. 4 may be arranged at two sides of one opening 113.

FIG. 3 further shows that an inner surface of the second housing 20 toward the first housing 10 includes a projecting part 22. The projecting part 22 is arranged to correspond to the concave portion 211.

The electronic device 100 further include a decorative cover 12 and a circuit board 30. The decorative cover 12 is detachably connected to the first housing 10 and covers the first receiving groove 11.

The circuit board 30 can be positioned between the first housing 10 and the second housing 20. The circuit board 30 may define a third through hole 31. The third through hole 31 can be arranged to correspond to the first through hole 111 and the second through hole 212. The electronic device 200 may further include electronic components (not shown) positioned on the circuit board 30.

Figure 6:
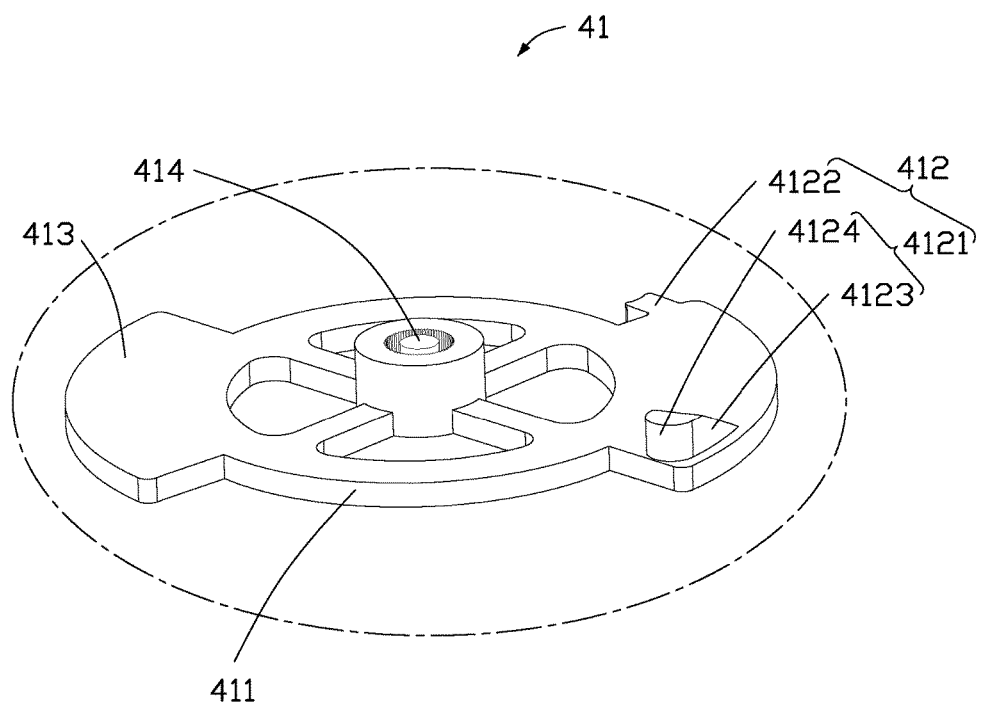
FIG. 6 is an enlarged view of circled portion VI of the electronic device shown in FIG. 4.

The mounting mechanism 40 includes a rotary plate 41, a micro switch 42, a driving rod 43, two clamping members 44, a fixed nut 45, and an elastic member 46. The rotary plate 41 is positioned in the first receiving groove 11. FIG. 6 shows the rotary plate 41 including a main portion 411, a first sliding portion 412, and a second sliding portion 413. The first sliding portion 412 and the second sliding portion 413 may be arranged at two sides of the main portion 411. The main portion 411 may be substantially circular, the first sliding portion 412 and the second sliding portion 413 may be substantially fan-shaped, and each of the first sliding portion 412 and the second sliding portion 413 is slidably received in a corresponding one of the two sliding rails 112. The rotary plate 41 may thus slide on the first housing 10 while being limited by the sliding rail 112. The blocking surface 1124 limits the rotation of the rotary plate 41, and the top surface 1121 limits the movement of the rotary plate 41 in a direction perpendicular to the first housing 10. Preferably, the first sliding portion 412 and the second sliding portion 413 each have substantially the shape of a quarter of a round disc.

The first sliding portion 412 includes a pressing protrusion 4121 and a positioning protrusion 4122. The pressing protrusion 4121 can be protruding out of a side of the first sliding portion 412 toward the second housing 20, and the pressing protrusion 4121 is capable of sliding in the opening 113. The pressing protrusion 4121 includes an inclined portion 4123 and a pressing portion 4124 connected to the inclined portion 4123. The inclined portion 4123 is inclined to the main portion 411, and the pressing portion 4123 is parallel to the positioning portion 411 and used to push the micro switch 42.

The positioning protrusion 4122 is arranged at one end of the first sliding portion 412 away from the pressing protrusion 4121. The positioning protrusion 4122 may extend from a side surface of the first sliding portion 412 toward the second sliding portion 413. The positioning protrusion 4122 abuts against the micro switch 42, thereby the rotary plate 41 can be positioned by the positioning protrusion 4122.

The rotary plate 41 is fixed to one end of the driving rod 43 by a fastening screw 414 running through the main portion 411.

The micro switch 42 is movably sleeved on the guiding column 13 and arranged adjacent to an end of one opening 113. The micro switch 42 is electrically connected to the circuit board 30 and configured to send signals to the circuit board 30. The micro switch 42 is pressed by the pressing protrusion 4121 when the pressing protrusion 4121 rotates above the micro switch 42, causing the micro switch 42 to send a first signal to the circuit board 30. After the rotary plate 41 rotates a specific angle (such as 90 degrees), the pressing protrusion 4121 moves away from the micro switch 42, and the micro switch 42 may move back to the original position and abut against the positioning protrusion 4122 of the rotary plate 41. At this time, the micro switch 42 can send a second signal to the circuit board 30, this works as a theft-prevention function.

Figure 7:
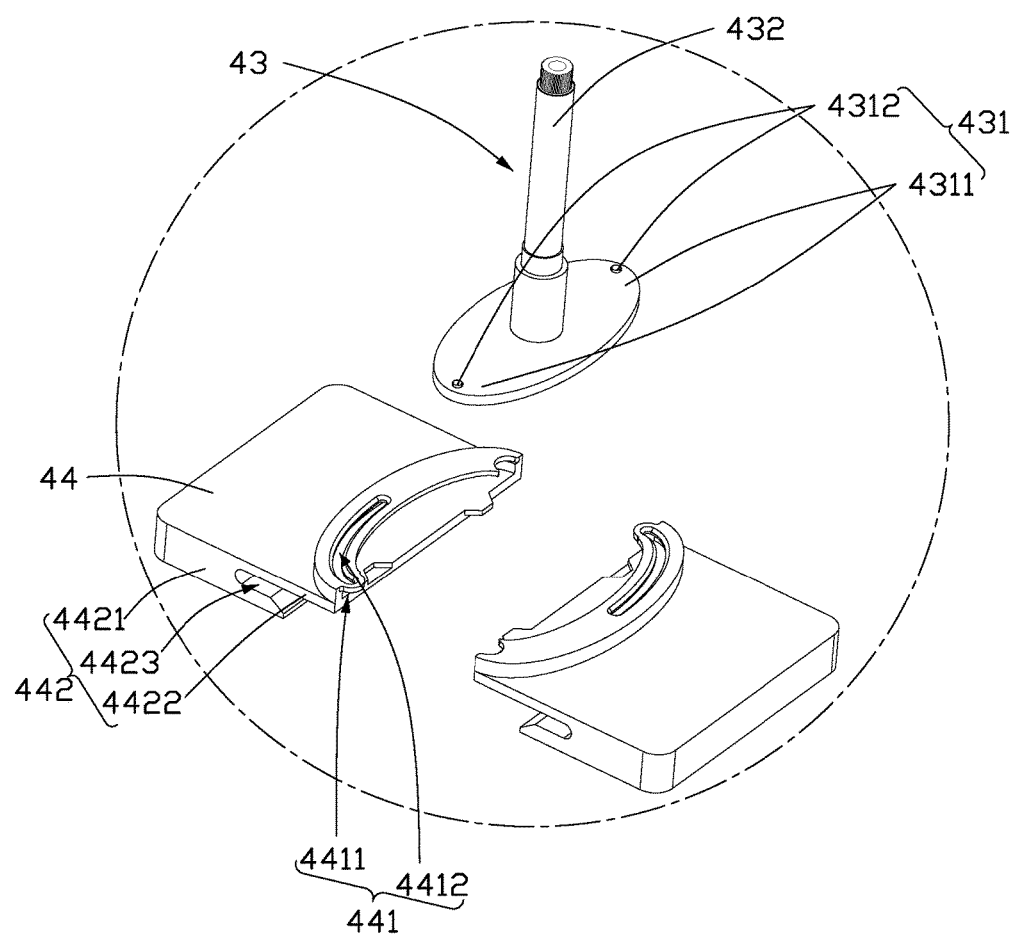
FIG. 7 is an enlarged view of circled portion VII of the electronic device shown in FIG. 3.

Two ends of the driving rod 43 pass through the first housing 10 and the second housing 20. FIG. 7 shows that the driving rod 43 includes a cam-shaped portion 431, and a rod portion 432 perpendicular to a central portion of the cam-shaped portion 431. The cam-shaped portion 431 is received in the second receiving groove 21, and a cross-section of the cam portion 431 may be elliptical in shape. The cam-shaped portion 431 includes two abutting ends 4311 opposing each other. The two abutting ends 4311 may be arranged at a longitudinal axis of the cam-shaped portion 431, and each abutting end 4311 may be equipped with a guiding screw 4312. Referring to FIG. 4 and FIG. 7, one end of the rod portion 432 away from the cam-shaped portion 431 may pass through the first receiving groove 11 and be connected to the rotary plate 41. The rod portion 432 can rotate with the rotary plate 41, thereby the cam-portion 431 can drive the two clamping members 44 to move toward or away from each other.

The two clamping members 44 may slide in the second receiving groove 21 of the second housing 20, and are arranged at two sides of the cam-shaped portion 431. Each clamping member 44 includes a curved protrusion portion 441 protruding out of a surface of the clamping member 44 toward the second housing 20. The protrusion portion 441 may be hollow, and a side of the protrusion portion 441 toward the driving rod 43 may define a sliding groove 4411 configured for receiving the cam-shaped portion 431. An inner wall of the protrusion portion 441 may be curved, and the abutting end 4311 of the cam-shaped portion 431 may abut against the inner wall of the protrusion portion 441. A top surface of the protrusion portion 441 may define a curved guiding groove 4412. The guiding groove 4412 may extend from a side of the protrusion portion 441 to a central portion of the protrusion portion 441, and the two guiding grooves 4412 may be symmetrical relative to the rod portion 432. The two guiding screws 4312 of the driving rod 43 are slidably received in the guiding grooves 4412 to guide the rotary motion of the driving rod 43. When the cam-shaped portion 44 is entirely received in the two sliding grooves 4411, the two protrusion portions 441 of the two clamping members 44 may abut each other. When each abutting end 4311 is arranged at a middle portion of the sliding groove 4411, the two clamping members 44 are distanced from each other.

One side of the clamping member 44 toward the driving rod 43 includes a holding portion 442, which is substantially in the shape of a U. The holding portion 442 includes a first holding side 4421, a second holding side 4422, and a slot 4423 formed between the first holding side 4421 and the second holding side 4422. The slot 4423 is used for clamping the fixing member 200. The first holding side 4421 is arranged at one side of the clamping member 44 away from the second housing 20, and a length of the first holding side 4421 is less than a length of the second holding side 4422.

The cam-shaped portion 431 is capable of sliding in the sliding grooves 4411. When the cam-shaped portion 44 is entirely received in the two sliding grooves 4411, the two protrusion portions 441 of the two clamping members 44 may abut each other. A first distance is formed between the two clamping portions 442, and the two clamping portions 442 cooperatively clamp the fixing member 200. After the driving rod 43 rotates, for example, having rotated through 90 degrees, the two abutting ends 4311 move to the middle portions of the sliding grooves 4411. The two clamping members 44 move away from each other, and a second distance is formed between the two clamping portions 442. The second distance is greater than the first distance, and the two clamping portions 442 no longer clamp the fixing member 200.

In another embodiment (not shown), the guiding grooves 4412 and the guiding screws 4312 can be omitted. The two clamping members 44 may be slidably received in the second receiving groove 21 by an elastic member (not shown). The elastic member provides force to move the two clamping members 44 toward each other. The resilient force of the elastic member is released when the cam-shaped portion 431 is entirely received in the two sliding grooves 4411, thus the two protrusion portions 441 of the two clamping members 44 abut each other, and the two clamping portions 442 are distanced from each other. When the two abutting ends 4311 are positioned at the middle portion of the two receiving grooves 4411, the two clamping members 44 move away from each other, the elastic member being compressed by the two clamping members 44 and thus accumulating elastic energy.

Figure 8:
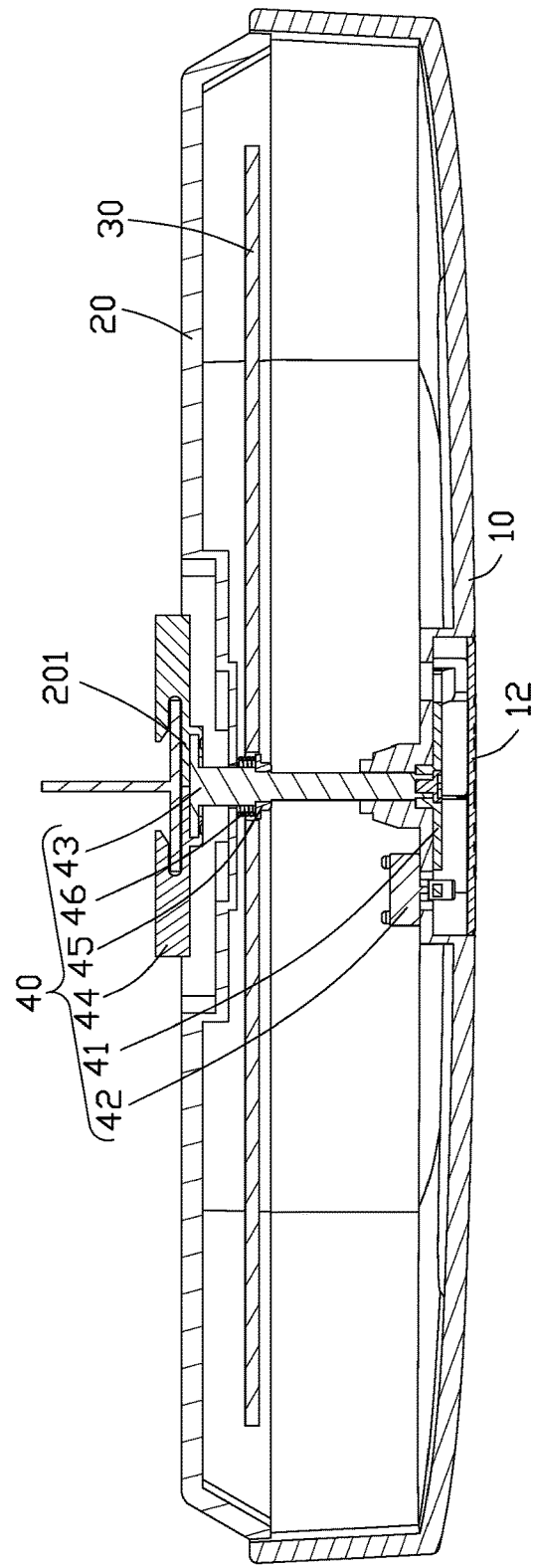
FIG. 8 is a cross-sectional view along line VIII-VIII of FIG. 2.

FIG. 8 shows that the fixed nut 45 and the elastic member 46 are sleeved on the rod portion 432. The fixed nut 45 is arranged at one side of the circuit board 30 toward the first housing 10. The elastic member 46 may be through the third through hole 31 of the circuit board 30 and be arranged between the fixed nut 45 and the projection part 22 of the second housing 20. Therefore, the rotary plate 41 is capable of moving along a direction perpendicular to the first housing 10, and moving back to the original position by the elastic restoring force provided by the elastic member 46.

Before mounting the electronic device 100 to the fixing member 200, the micro switch 42 is pushed by the pressing protrusion 4121, the two abutting ends 4311 are arranged at the middle of the sliding groove 4411 of the clamping member 44, and the two clamping members 44 are distanced from each other.

To mount the electronic device 100, the decorative cover 12 is removed, and the second housing 20 of the electronic device 100 is arranged toward the fixing member 200. Then, the rotary plate 41 is pressed toward the second housing 20, the elastic member 46 is compressed, and the two clamping members 44 protrude out of the second receiving groove 21 of the second housing 20. After that, the rotary plate 41 is rotated through a predetermined angle, such as 90 degrees. The pressing protrusion 4121 no longer presses the micro switch 42, and the micro switch 42 abuts the positioning protrusion 4122. The driving rod 43 rotates with the rotary plate 41, enabling the cam-shaped portion 431 to be entirely received in the sliding grooves 4411 of the two clamping members 44. The two clamping members 44 move toward each other, thereby the clamping portions 442 of the two clamping members 44 cooperatively clamp the fixing member 200. Then the decorative cover 12 is remounted to the first housing 10. The electronic device 100 is mounted to the fixing member 200 at this time.

To disassemble the electronic device 100 from the fixing member 200, the decorative cover 12 is removed. The rotary plate 41 is rotated through a predetermined angle, such as 90 degrees, but in a reverse direction. The micro switch 42 is thus pressed by the pressing protrusion 4121 of the rotary plate 41. At this time, the rotary plate 41 is moved away from the first housing 10 by the resilient force provided by the elastic member 46 and back to the original position, and the driving rod 43 rotates with the rotary plate 41. The two clamping members 44 move away from each other, and are again received in the second receiving groove 21 of the second housing 20. The electronic device 100 can thus be detached from the fixing member 200.

The electronic device 100 includes the first housing 10, the second housing 20, the circuit board 30, and the mounting mechanism 40. The mounting mechanism 40 includes the rotary plate 41, the driving rod 43, and two clamping members 44. The rotary plate 41 is received in the first receiving groove 11. The driving rod 43 includes the cam-shaped portion 431 and the rod portion 432, the cam-shaped portion 431 is received in the second housing 21, and a cross-sectional view of the cam-shaped portion 431 shows an elliptical shape. One end of the rod portion 432 away from the cam-shaped portion 431 may run through the first receiving groove 11 and be connected to the rotary plate 41. The two clamping members 44 may be slidably received in the second receiving groove 21. The rotary plate 41 can rotate the rod portion 432 and the cam-shaped portion 431, urging the two clamping members 44 to move toward each other. Thereby, the two clamping members 44 can cooperatively clamp the fixing member 200 to mount the electronic device 100 to the fixing member 200.

The electronic device 100 including the mounting mechanism 40 can be mounted to the fixing member 200 without additional accessories. The mounting and demounting processes are fast and simple, thereby the installation efficiency is improved. The above installation mechanism 40 is simple in structure and low in cost. In addition, the above installation mechanism 40 also includes the micro switch 42. The micro switch 42 can send the signals to the circuit board 30 when being removed, and the electronic device 100 can send an anti-theft warning signal or sound.

In other embodiments, the clamping member 44 may have other shapes, as long as the two clamping members 44 can still clamp the fixing member 200.

In other embodiments, the fixed nut 45 and the elastic member 46 may be omitted, and the rotary plate 41 may be moved back to the original position manually.

In other embodiments, the micro switch 42 may be omitted.

It is to be understood, however, that even through numerous characteristics and advantages of the present disclosure have been set forth in the foregoing description, together with details of assembly and function, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:

1. An electronic device, comprising:
a first housing, an outer surface of the first housing defines a first receiving groove;
a second housing, an outer surface of the second housing defines a second receiving groove; and
a mounting mechanism, comprising
a rotary plate received in the first receiving groove;
a driving rod, and
two clamping members each slidably received in the second receiving groove;
wherein the driving rod comprises a cam-shaped portion and a rod portion connected to the cam-shaped portion, the cam-shaped portion is received in the second receiving groove and a cross-section of the cam-shaped portion is elliptical in shape; the rod portion passes through the first housing and the second housing, and one end of the rod portion away from the cam-shaped portion is received in the first receiving groove and connected to the rotary plate; and wherein the two clamping members move toward each other when the cam-shaped portion is rotated with the rotary plate, thereby the two clamping members cooperatively clamp a fixing member to mount the electronic device to the fixing member.

2. The electronic device of claim 1, wherein one side of the clamping member toward the driving rod comprises a holding portion, and the holding portion comprises a first holding side, a second holding side, and a slot formed between the first holding side and the second holding side and the holding portion is configured for clamping the fixing member.

3. The electronic device of claim 2, wherein the first holding side is arranged at one side of the clamping member away from the second housing, and a length of the first holding side is less than a length of the second holding side.

4. The electronic device of claim 2, wherein the cam-shaped portion comprises two abutting ends opposing each other, and each of the clamping members comprises a curved protrusion portion protruding out of a surface of the clamping member toward the second housing; and wherein the two protrusion portions of the two clamping members abut each other when the cam-shaped portion is entirely received in the two clamping members; and the two clamping members are distanced from each other when each of the abutting ends is arranged at a middle portion of the clamping member.

5. The electronic device of claim 1, wherein a central portion of the first receiving groove defines a first through hole, the first receiving groove comprises two guiding rails protruding out of the first receiving groove, and the two guiding rails are arranged at two sides of the first though hole and are symmetrical relative to the first hole; and wherein the rotary plate comprises a main portion, a first sliding portion, and a second sliding portion, the first sliding portion and the second sliding portion are arranged at two sides of the main portion, and each of the first sliding portion and the second sliding portion is slidably received in a corresponding one of the two guiding rails.

6. The electronic device of claim 5, wherein the first sliding portion and the second sliding portion each has substantially a shape of a quarter of a round disc.

7. The electronic device of claim 5, wherein each of the two guiding rails comprises a top surface and two side surfaces, the top surface is arranged at the guiding rail away from the bottom of the first receiving groove, each of the side surfaces is connected between the top surface and the bottom of the first receiving groove; and wherein the side surface adjacent to the first through hole defines a via hole, and the via hole is defined at a side of the side surface facing the bottom of the first receiving groove.

8. The electronic device of claim 5, wherein the first receiving groove further define two openings, each of the openings faces one corresponding guiding rail, and the electronic device further comprises a circuit board arranged between the first housing and the second housing; and wherein the mounting mechanism further comprises a micro switch, the micro switch is arranged adjacent to an end of one of the openings and is electrically connected to the circuit board, and the micro switch is configured to send signals to the circuit board.

9. The electronic device of claim 8, wherein an inner surface of the first housing toward the second housing comprises a guiding column, and the micro switch is movably sleeved on the guiding column.

10. The electronic device of claim 8, wherein the first sliding portion comprises a pressing protrusion protruding out of a side of the first sliding portion toward the second housing, and the pressing protrusion is capable of sliding in the corresponding opening.

11. The electronic device of claim 10, wherein the pressing protrusion comprises an inclined portion and a pressing portion connected to the inclined portion, the inclined portion is inclined to the main portion, and the pressing portion is parallel to the positioning portion and configured to push the micro switch.

12. The electronic device of claim 10, wherein the first sliding portion further comprises a positioning protrusion arranged at one end of the first sliding portion away from the pressing protrusion, the positioning protrusion extends from a side surface of the first sliding portion toward the second sliding portion, and the positioning protrusion is configured to abut against the micro switch, thereby the rotary plate is positioned by the positioning protrusion.

13. The electronic device of claim 1, wherein the mounting mechanism further comprises an elastic member sleeved on the rod portion, and the rotary plate is capable of moving along a direction perpendicular to the first housing by a resilient force provided by the elastic member.

14. The electronic device of claim 1, wherein one side of each of the clamping members toward the driving rod defines a sliding groove, and the cam-shaped portion is capable of rotating in the sliding grooves of the two clamping members.

15. The electronic device of claim 14, wherein a top surface of the protrusion portion defines a curved guiding groove, the guiding groove extends from a side of the protrusion portion to a central portion of the protrusion portion, and the two guiding grooves are symmetrical relative to the rod portion; and wherein each of the two abutting ends comprises a guiding screw, and the guiding screw is slidably received in the corresponding guiding groove.

16. The electronic device of claim 1, wherein the electronic device further comprises a decorative cover detachably connected to the first housing and configured to cover the first receiving groove.

* * * * *